United States Patent [19]

Bechdolt

[11] 4,321,490
[45] Mar. 23, 1982

[54] TRANSISTOR LOGIC OUTPUT FOR REDUCED POWER CONSUMPTION AND INCREASED SPEED DURING LOW TO HIGH TRANSITION

[75] Inventor: Robert W. Bechdolt, Portland, Me.

[73] Assignee: Fairchild Camera and Instrument Corporation, Mt. View, Calif.

[21] Appl. No.: 34,380

[22] Filed: Apr. 30, 1979

[51] Int. Cl.³ ............... H03K 19/088; H03K 19/084; H03K 19/013
[52] U.S. Cl. ................... 307/456; 307/443; 307/458; 307/547; 307/561
[58] Field of Search ............... 307/203, 213, 214, 215, 307/270, 280, 300, 317 A, 443, 456, 458, 547, 561

[56] References Cited

U.S. PATENT DOCUMENTS

| | | | |
|---|---|---|---|
| 3,641,362 | 2/1972 | Gamble | 307/215 |
| 3,641,368 | 2/1972 | Gamble et al. | 307/215 X |
| 3,699,362 | 10/1972 | Jordan | 307/215 X |
| 3,824,408 | 7/1974 | Brunel | 307/270 X |
| 3,867,644 | 2/1975 | Cline | 307/215 X |
| 3,958,136 | 5/1976 | Schroeder | 307/270 X |
| 4,002,931 | 1/1977 | Tsang et al. | 307/DIG. 1 X |
| 4,042,840 | 8/1977 | Chan | 307/215 X |
| 4,092,551 | 5/1978 | Howard et al. | 307/270 X |
| 4,131,808 | 12/1978 | Kuo | 307/270 |
| 4,191,899 | 3/1980 | Tomczak et al. | 307/215 X |

OTHER PUBLICATIONS

Chang et al., IBM Tech. Disclosure Bulletin, vol. 18, No. 11, pp. 3635–3636, 4/76.
Klara et al., IBM Technical Disclosure Bulletin, vol. 16, No. 11, p. 3598, 4/74.
Berndlmaier et al., IBM Technical Disclosure Bulletin, vol. 18, No. 5, pp. 1404–1405, 10/75.
Kronlage, 1971 IEEE Int'l. Convention Digest, Session 3B, Paper 3B.5, pp. 144–145, 3/71.

Primary Examiner—Larry N. Anagnos
Attorney, Agent, or Firm—Paul J. Winters; Theodore S. Park; Ronald J. Meetin

[57] ABSTRACT

In a transistor logic output device the improvement comprising an active element discharging transistor coupled between the base of the pulldown element transistor and ground or low potential for actively controlling a route to ground or low potential for diverting and discharging so-called capacitive feedback Miller current generated during the low to high voltage transition at the output of the device resulting from base-collector junction capacitance in the pulldown element transistor. The invention includes capacitive coupling means coupled at the base of the active element discharging transistor to follow changes in voltage at the device output and capacitively feed back current during transistion from low to high potential at the device output for driving the base of the discharge transistor thereby providing a low impedance path to ground or low potential at the base of the pulldown element transistor for diverting and discharging capacitive Miller feedback current.

10 Claims, 8 Drawing Figures

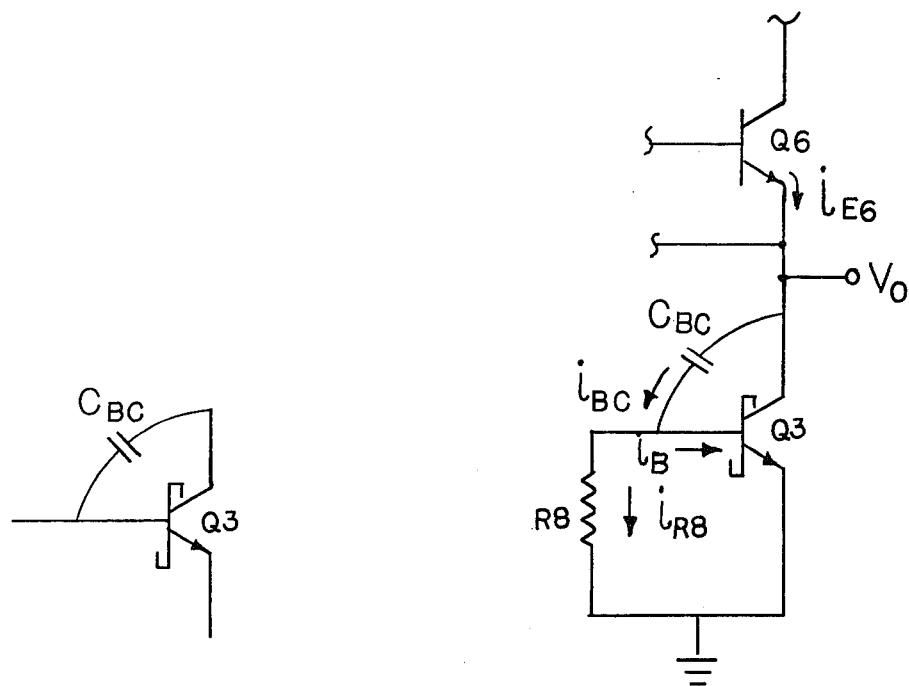
FIG 3
FIG 3A
(PRIOR ART)
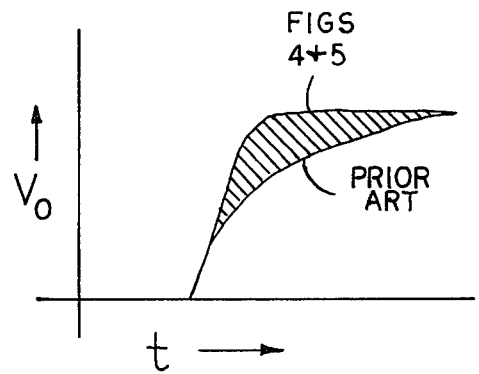
FIG 3B
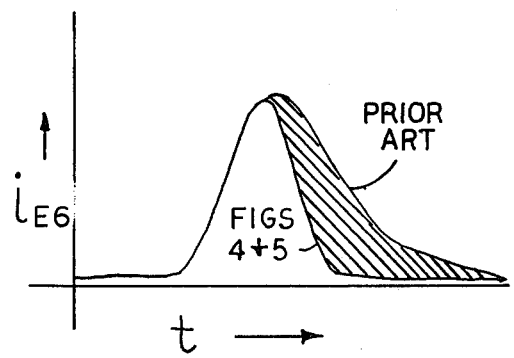
FIG 3C

TRANSISTOR LOGIC OUTPUT FOR REDUCED POWER CONSUMPTION AND INCREASED SPEED DURING LOW TO HIGH TRANSITION

FIELD OF THE INVENTION

This invention relates to a new and improved transistor logic output device for transistor logic circuits, which reduces power consumption and increases switching speed during the transition from low to high potential at the output of the device. In particular, the present invention is contemplated for use in TTL and DTL integrated circuits and is directed to eliminating the problems caused by so-called "Miller current" which retards turn-off of the pulldown element during transition from low to high potential at the output gate.

BACKGROUND OF THE INVENTION

In conventional transistor-transistor logic (TTL) and diode-transistor logic (DTL) devices, logical values corresponding to binary "1" and "0" are ordinarily represented at the output by a high level voltage $V_{oh}$, for example greater than 2.4 volts, and a low level voltage $V_{ol}$, for example less than 0.8 volts. In positive logic, the high level binary "1" is derived from a voltage source $V_{cc}$ which "sources" the current to the output when a binary "1" is to be delivered by the output gate. When a binary "0" is required at the output, the output gate blocks sourcing current and instead "sinks" the current from the output load to ground so that the low level voltage $V_{ol}$ appears at the output of the logic gate. Thus, the typical TTL output gate functions by "sourcing" and "sinking" current at the output according to whether a binary "1" (high level voltage) or a binary "0" (low level voltage) is the desired outcome of previously executed logical operations. In negative logic the representation of binary 1 and 0 by high and low level voltage is reversed.

A conventional low power Schottky TTL output device 10 is illustrated in FIG. 1. Several elements or stages can be identified in such a TTL output gate. The "pullup" element 11 for sourcing current from the higher level voltage $V_{cc}$ and delivering binary 1 consists of transistors Q5 and Q6 forming a Darlington transistor pair that can supply a relatively large current between the high level voltage source $V_{cc}$ and the output $V_o$ when a much smaller current is applied to the base of Q5. The "pulldown" element or stage 12 for sinking current from the output to ground consists of transistor Q3 with conventional squaring network 16 at its base comprised of resistors R7 and R8 and transistor Q4. The phase splitter element or stage 13 consists of transistor Q1 which receives the data signal input to the gate in the form of a high or low level voltage at $V_{in}$ and controls the pullup and pulldown elements for either sourcing or sinking current at the output 14 as determined by the data signal input to the gate.

When a low voltage or potential appears at the input 15, a low voltage also appears at the base of phase splitter transistor Q1 and this transistor is deprived of base drive current so that it no longer conducts current through its collector to emitter thereby turning off pulldown transistor Q3. Ideally, the output $V_o$ of the gate is therefore isolated from ground. At the same time, because Q1 is non-conducting, the high level voltage $V_{cc}$ appears at the base of sourcing transistor Q5 supplying base current for transistor Q5 which turns on and supplies current to the base of Q6 which in turn becomes conducting and "sources" current from $V_{cc}$ to the output $V_o$. The TTL logic gate is therefore inherently inverting as a binary 0 at the input $V_{in}$ represented by a low voltage level generates a binary 1 at the output represented by voltage level $V_{oh}$.

When a binary 1 appears at the input, current from R1 supplies base drive to transistor Q1, Q1 becomes conducting, sinking current from the base of Q5 and therefore turning off the Darlington transistor current source represented by transistors Q5 and Q6. Current from high level voltage $V_{cc}$ is therefore no longer sourced to the output 14. At the same time, pulldown transistor Q3 becomes conducting through its collector to emitter to ground as a result of the current supplied to its base and begins to discharge current from whatever load capacitance may be coupled to the output 14 of the gate, bringing the output $V_o$ to a low level potential corresponding to binary 0.

As shown in FIG. 1 and in later figures, some of the transistor and diode components are typically Schottky diodes and transistors indicated by the opposite square hooks in the schematic symbols. The Schottky clamping effected by an internal modification in these devices produces quicker turn-off during switching. A transistor logic output gate of the type illustrated in FIG. 1 however, suffers the disadvantage of high power consumption and retarded switching during transition from low to high potential at the output as hereafter described.

In FIG. 2 there is illustrated an advanced Schottky TTL output gate 20 according to the present state of the art. The elements of the device include the pullup element 21, pulldown element 22 with squaring network 26 at the base of pulldown transistor Q3, and two gain stage phase splitter 23. This output device is similar to the low power Schottky TTL output gate described above except that an additional stage of gain has been added to the phase splitter element. Thus, components in FIG. 2 performing the same function as described above with reference to FIG. 1 are similarly designated and an additional stage of gain for the phase splitter element has been added by way of transistor Q2. A high level voltage at the input 25 corresponding to a binary 1 permits Q1 and Q2 then Q3 to conduct with three stages of current gain, sinking current from the output 24, and clamping the output to a low level voltage corresponding to a binary 0. With Q2 conducting the Darlington transistor pullup element 21 is deprrived of base drive current and transistors Q5 and Q6 turn off. Diode D3 speeds up turn off of the transistor Q6. Current from high level voltage supply $V_{cc}$ is therefore no longer sourced to the output 24.

The speed at which pulldown element transistor Q3 discharges load capacitance at the output 24 during this transition from high to low at the output depends on the base current delivered at Q3. The process is enhanced by Diode D4 which diverts some of the output load discharge current to the collector of phase splitter stage Q2. The increased emitter current of transistor Q2 becomes the base current $i_b$ to pulldown transistor Q3 which current is then multiplied by the gain $\beta$ of transistor Q3 resulting in a larger collector current $i_c = \beta i_b$, sinking current from the load and switching the output from binary 1 to binary 0 at a faster rate.

With a low level voltage corresponding to binary 0 at the input 25, diodes D1 and D2 conduct, depriving the two stage phase splitter transistor of base current so that they turn off. The diode D2 has been added to speed up the turn off of transistor Q2. With Q2 not conducting, voltage rises at the base of Q5 delivering base current so that Q5 becomes conducting, turning on Q6 and sourcing current from $V_{cc}$ to the output 24. At the same time pulldown transistor Q3 begins to turn off so that the output voltage can rise to high level binary 1.

The problem addressed by the present invention arises during this transition from low to high level voltage at the output in both of the transistor logic output devices illustrated in FIGS. 1 and 2. In the ideal situation during low to high transition at the output, the pulldown element transistor Q3 would turn off completely before a large current begins to flow from the pullup element Darlington transistor current source into the load capacitance. In the actual case, the pulldown element is turning off and the pullup element is turning on over a period of time with overlap so that some of the pullup current flows through the pulldown element to ground instead of into the load capacitance. One result is wasteful consumption of power.

The reason that pulldown element transistor Q3 does not turn off completely is because of the occurrence of parasitic capacitance in transistors, primarily the capacitance associated with the base-collector junction. Since pulldown transistor Q3 is required to conduct large amounts of current in sinking current from the load, it is physically larger than most of the transistors in the circuit and thus has a large base-collector capacitance. The equivalent circuit showing the effect of this base-collector junction capacitance on transistor Q3 is illustrated in FIG. 3 where the equivalent feedback capacitance accompanying the junction is shown as $C_{bc}$ connected across the base and collector of transistor Q3. This relatively large base to collector junction capacitance $C_{bc}$ in the pulldown element transistor is known as the "Miller capacitance". When the voltage or potential at the output is rising, a significant amount of current $i_{bc}$ is generated proportional to the rate of change of voltage across the base collector capacitance $C_{bc}$. This current is also referred to as the "Miller current". Some of this Miller current flows into the base of Q3 designated in FIG. 3 as $i_b$ which base current is then multiplied by the gain $\beta$ of the transistor Q3 resulting in a large collector current $i_c = \beta i_b$ from Q3. This large current to ground diverts current from the pullup element reducing its effectiveness in charging up the load capacitance. As a result, there is wasteful power consumption and retardation or delay in the turnoff of pulldown element transistor Q3.

For further insight into the problem, reference is made to the squaring networks 16 and 26 of FIGS. 1 and 2 respectively coupled between the base of pulldown transistor Q3 and ground. The squaring network, consisting of transistor Q4 and resistors R7 and R8, is so named because its function is to square off the transfer characteristics of the device. When Q3 is conducting, a small current passes through resistor R7 saturating Q4. R8 must be large to limit the current flow away from the base of Q3 so that Q3 will not significantly be deprived of base current during the time when Q3 must conduct large current through its collector from the output. When Q2 and Q3 are turning off, R8 and Q4 pull current out of the base of Q3 to turn it off quickly.

The value of resistor R8 must therefore be a tradeoff. It must pass enough current to discharge Q3 rapidly during turnoff of the pulldown element. On the other hand, it must still be a large resistance, large enough to restrict current loss to ground so that current to the base of Q3 is not drained or sunk when Q3 is trying to conduct.

It is also frequently the case in conventional TTL and DTL transistor logic output devices that instead of a squaring network, a resistance alone is used coupled between the base of pulldown transistor Q3 and ground to facilitate turn off of Q3 during transition. Similarly, such resistance must be large and in that respect similar to R8 so the discussion here is also applicable.

The impact of this limitation of the squaring network 16 and 26 of FIGS. 1 and 2 and of the pulldown element base to ground turnoff resistance in some conventional transistor logic output devices is presented with reference to FIG. 3A. The objective during transition from low to high potential at the output is to turn off Q3 completely and quickly before the Darlington transistor current source pullup element begins to conduct. Because of the Miller capacitance and Miller current, and because of the high resistance limitations on the squaring network or pulldown transistor base turnoff resistance, this is not possible in the conventional circuits illustrated in FIGS. 1 and 2. The Miller capacitance $C_{bc}$ is always present at the base collector junction and cannot be eliminated. As shown in FIG. 3A for positive changing voltage during transition from low to high potential at the output current is generated and flows through $C_{bc}$ in the form of the Miller current $i_{bc}$. This Miller current divides, one portion flowing through the squaring network resistance or through the base to ground resistance R8, this portion designated $i_r$. The other portion flows into the base of pulldown transistor Q3 and is designated $i_b$. This portion $i_b$ of the Miller current is multiplied by the gain $\beta$ of transistor Q3 so that Q3 will not turn off but continue to conduct current while the pullup element is trying to deliver current to the output. The result as described above is wasteful power consumption and delay in transition.

It is apparent that the current $i_b$ flowing into the base of Q3 must be eliminated to avoid the harmful effects of the Miller current. This base feedback current $i_b$ equals $i_{bc} - i_r$, that is the Miller current minus the portion diverted through resistance R8, and this could only be done if $i_r$ were equal to or greater than the Miller current $i_{cb}$. However, this condition that $i_r$ be greater than or equal to the Miller current cannot be achieved in the conventional circuits of FIGS. 1 and 2 because resistance R8 must have such a large value for the reasons heretofore described. Q3 will therefore stay on until the voltage at the output stops changing from low to high as the Miller current across the Miller capacitance is proportional to the rate of change of potential across it. During this time, considerable current passes to ground from the pullup element through the still conducting pulldown transistor wasting power. This inefficient transition of the voltage output accompanying the parasitic capacitive feedback Miller current in prior art devices is shown graphically in FIGS. 3B and 3C alongside the more ideal characteristics sought and achieved by the present invention, the shaded portions representing some measure of the wasted power. These graphs are of course intended to present only a qualitative picture of a comparison of characteristics between the prior art transistor logic output devices and the devices of the present invention as exemplified and hereafter described with reference to FIGS. 4 and 5.

SUMMARY OF THE INVENTION

It is therefore an object of the present invention to provide a new and improved transistor logic output device with reduced power consumption and improved transition characteristics and speed during the transition from low to high potential at the output of the device.

Another object of the invention is to provide a transistor logic output gate which pulls parasitic Miller capacitance feedback current away from the base of the pulldown element transistor thereby to avoid the $\beta$ gain multiplication of Miller current by the pulldown transistor.

Yet another object of the invention is to provide an active element for controlling the Miller feedback current without otherwise interfering in the circuitry or impairing the function of the transistor logic output device.

In order to accomplish these results, the present invention contemplates providing in a transistor logic output gate the improvement comprising an active element having high and low impedance states coupled at the base of the pulldown element transistor means to define a route to ground or low potential of normally high impedance, and capacitive coupling means coupled to follow changes in the voltage at the output of the device for positive feedback of current to drive the active element to a low impedance state during transition from low to high potential at the output of the device. According to one aspect of the invention, the capacitive coupling for control of the active element is coupled directly to the output, while according to another aspect and preferred embodiment the capacitive coupling is coupled to the base of the second stage of the Darlington pullup element. A feature and advantage of the latter arrangement is that it permits following the transitions from low to high voltage at the device output indirectly, isolating the capacitive coupling from transient voltage changes at the output.

More specifically, the invention contemplates providing in a transistor logic output device the improvement comprising active element discharging transistor means coupled between the base of the pulldown element transistor and ground or low potential for actively controlling a route to ground or low potential for diverting and discharging the so-called capacitive feedback Miller current generated during the low to high potential transition at the output of the device resulting from base-collector junction capacitance in the pulldown element transistor. The active element discharging transistor is controlled by capacitive coupling means coupled at the base of the active element discharging transistor means to follow changes in voltage at the device output and capacitively feed back current during the transition from low to high potential at the device output for driving the base of the discharge transistor thereby providing a low impedance path to ground or low potential at the base of the pulldown element transistor means for diverting and discharging the capacitive Miller feedback current.

In a preferred form, the capacitive coupling for control of the active element comprises back biased junction capacitor coupling means coupled at the base of said Miller current discharging transistor means to follow changes in potential at the device output for capacitive feedback of current and for capacitive coupling characteristics paralleling the Miller capacitance characteristics.

According to other features of the invention there are provided first diode means coupled between the active element discharging transistor means and the base of the pulldown element transistor means to prevent the potential level at said base from being pulled too low relative to the potential level at the device input; and second diode means for clamping the base of the active element discharging transistor means to the base of the pulldown element transistor thereby to prevent the voltage at the base of the discharging transistor means from following the capacitive coupling means to too low a potential during the transition from high to low potential at the device output whereby the discharge transistor means can timely respond to a transition from low to high potential at the output and timely discharge the capacitive feedback Miller current from the base of the pulldown element transistor means.

From a broader perspective it can be seen that the present invention contemplates means and methods for capacitively coupling and following voltage changes at the output of a transistor logic output device; then generating capacitive current through the coupling for positive feedback, and amplifying the positive feedback capacitive current to approach or equal the negative feedback capacitive Miller current at the base of the pulldown element junction transistor; finally reducing negative feedback Miller current with the amplified positive feedback capacitive current.

More specifically, the invention contemplates the method of capacitively coupling and following changes in voltage at the output of a transistor logic output device, generating capacitive feedback current through the coupling during transition from low to high potential at the output of the device, and amplifying the capacitive feedback current to approach or equal the Miller feedback current at the base of the pulldown element junction transistor means. Thereafter the coupling arrangements of the present invention effect the steps of reversing the polarity of the amplified capacitive current and applying it to the base of the pulldown transistor means thereby neutralizing Miller feedback current at the base of the pulldown transistor.

Other objects features and advantages of the present invention will become apparent in the following specification and accompanying drawings.

BRIEF DESCRIPTION OF THE DRAWINGS

FIG. 3 is a schematic diagram detail of the pulldown element transistor and equivalent Miller capacitance at the base collector junction of the transistor.

FIG. 3A is a schematic diagram detail similar to FIG. 3 but showing in addition the division of capacitive feedback Miller current at the base of the pulldown transistor.

FIGS. 3B and 3C are qualitative graphs showing the relationship in time respectively of the voltage output transition and Darlington output current in the prior art circuits of FIGS. 1–3 and in the devices of the present invention.

DESCRIPTION OF THE PREFERRED EMBODIMENT

Figure 1:
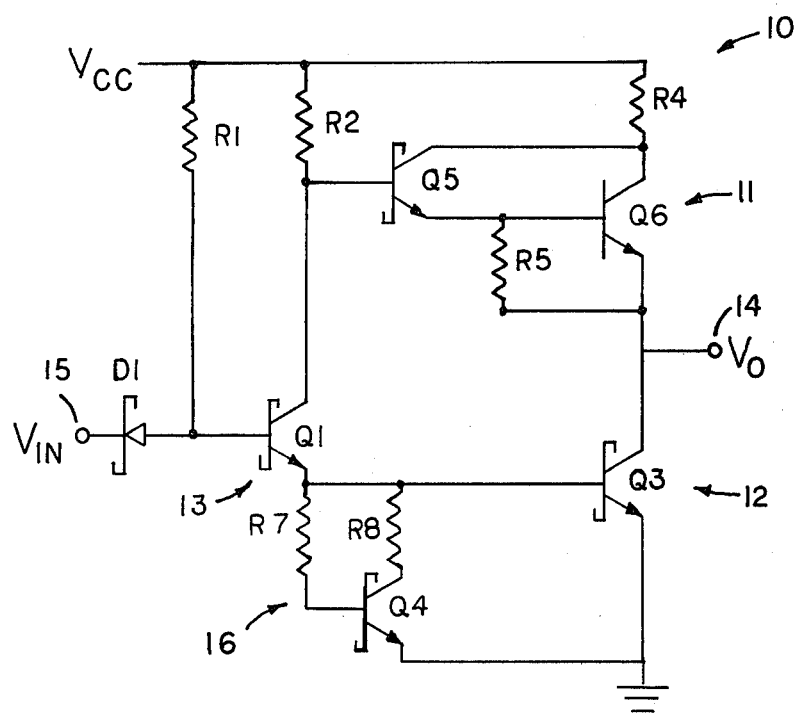
FIG. 1 is a schematic diagram of a low power Schottky transistor logic output gate or device according to the present state of the art.
Figure 4:
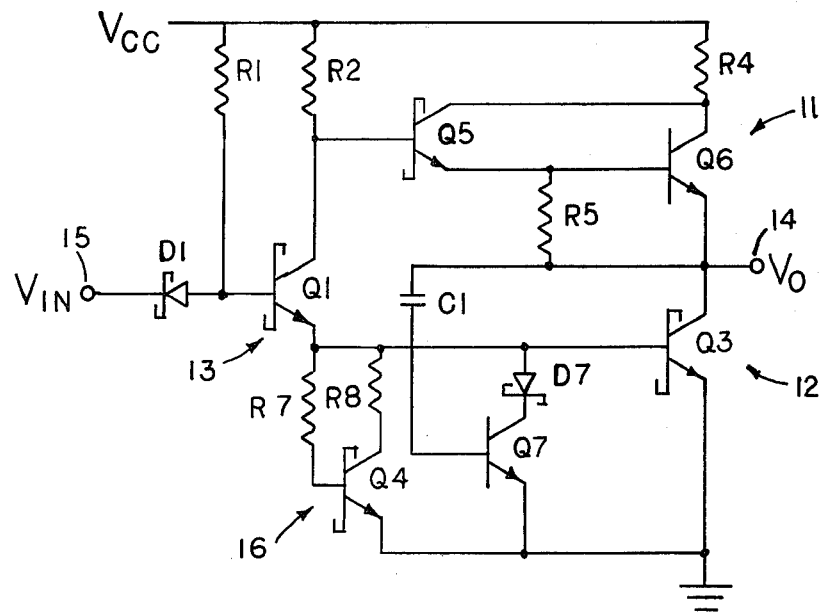
FIG. 4 is a schematic diagram of a low power Schottky transistor logic output device similar to that illustrated in FIG. 1 but modified in accordance with the present invention by the addition of components C1, D7 and Q7.

The transistor logic output device according to the present invention illustrated in FIG. 4 is a low power Schottky TTL gate which, but for the modifications of the present invention, operates in every respect like the device illustrated in FIG. 1. Therefore all of the portions for which the previous description for FIG. 1 is applicable are given the same component and numeral designations. To the circuit of FIG. 1, however, have been added components Q7, D7 and C1. Transistor Q7, coupled through diode D7 between the base of pulldown transistor Q3 and ground affords an "active" means for diverting Miller feedback current from the base-collector junction capacitance of Q3 to ground. Furthermore, the active element Q7 normally in the non-conducting or high impedance state is controlled and switched to a conducting or low impedance state by current through capacitor C1, generated by changes of voltage at the output. Thus, C1 is coupled between the output and the base of Q7.

In the steady state at the output either high or low potential, there is no current through C1 to the base of Q7, for the capacitive feedback current through C1 is proportional to the rate of change of voltage applied to C1. Thus, the components added by the present invention function only during the transitions in voltage at the output. Furthermore, during the transition from high to low voltage at the output, C1 passes current away from the base of Q1 further holding it in the non-conducting state. Therefore, the improvement of the present invention only functions during the transition from low to high at the output when capacitive current is generated and passed across C1 from the output load to the base of Q7. Q7 becomes conducting and provides a low impedance to ground through D2 discharging the Miller current at the base of Q3 to ground.

During the steady state with either a high or low potential at the output, and during transition from high to low at the output, active element discharge transistor Q7 remains non-conducting and the added circuit elements of the present invention will not affect the rest of the circuit. On the other hand, during the transition from low to high potential at the output, capacitive feedback current through coupling capacitor C1, paralleling the parasitic feedback Miller current through the base collector junction capacitance of pulldown transistor Q3, turns on Q7 which, through diode D7 affords a low impedance route to ground for diverting and discharging the Miller feedback current arriving at the base of Q3.

Transistor Q7 is generally not Schottky clamped so that it truly does saturate leaving no or negligible voltage drop across the collector to emitter. The voltage drop across D7 is about 0.6 v which is less than the 0.8 v necessary to turn on Q3. Thus during the transition from low to high potential at the output when Miller feedback current is problematic in conventional output gates retarding turn off of the pulldown transistor, in the output device of the present invention the base of pulldown transistor Q3 is clamped to a voltage level below that which would turn on Q3. By this expedient, the pulldown transistor is promptly turned off, the transition characteristics improved, and power conserved as shown in FIGS. 3B and 3C.

Thus, according to the present invention, a feedback capacitance C1 is added which passes current proportional to the rate of change of voltage at the output during transition from low to high potential to drive an active element discharge transistor Q7 to conduction and divert the simultaneously occurring Miller capacitance feedback current from the base of the pulldown transistor to ground. In effect, the present invention provides means for generating an opposite current to neutralize the effect of the Miller current. While the "opposing" current generated through C1 is smaller than that through $C_{bc}$, it is amplified by active element transistor Q7 to approach the level of the Miller feedback current.

The diode D7 through which the base of pulldown transistor Q3 is clamped to a voltage of, for example, 0.6 v during transition from low to high at the output, a voltage level which prevents Q3 from turning on, also prevents the base of Q3 from being pulled to too low a voltage relative to the low level voltage at the input. Thus, D7 is required to prevent a condition where a low voltage at the input through D1 is actually high enough relative to an even lower voltage to which the base of Q3 has been pulled through the conducting discharge transistor Q7, that the voltage difference causes Q1 to conduct, turning off Q5 and Q6, causing the output voltage $V_o$ to fall, drawing current through C1, turning off Q6, so voltage builds up at the base of Q3, turning Q1 back off and starting the cycle again leading to oscillation or instability. Therefore, D7 is included so that the base of Q3 cannot be pulled down to too low a voltage level setting off the sequence above.

Figure 2:
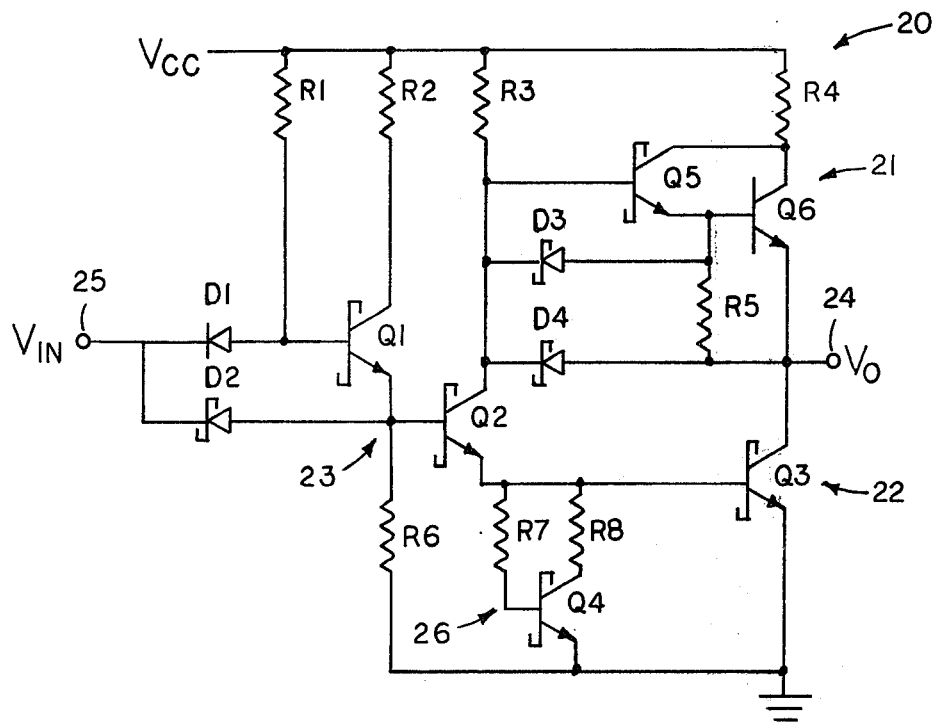
FIG. 2 is a schematic diagram of an advanced Schottky transistor logic output gate according to the present state of the art.
Figure 5:
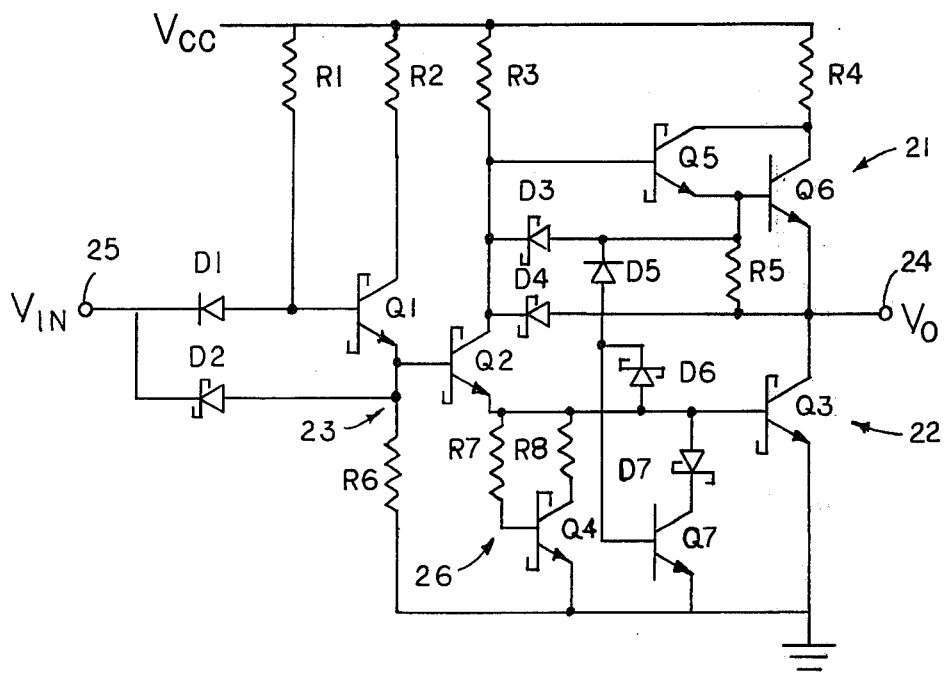
FIG. 5 is a schematic diagram of an advanced Schottky transistor logic output device similar to that illustrated in FIG. 1 but modified in accordance with the present invention by the addition of components Q7, D5, D6 and D7.

The preferred implementation of the invention is illustrated in FIG. 5. In this case, the starting circuit is the same advanced Schottky TTL output gate illustrated in FIG. 2 with the addition of components Q7, D5, D6, and D7. But for these modifications the circuit operates in every respect like the device illustrated in FIG. 2 and therefore the portions for which the previous description for FIG. 2 is applicable are given the same component and numeral designations. A number of innovations in addition to those discussed with reference to FIG. 4 are found in the circuit of FIG. 5.

First, the capacitive coupling for following voltage changes at the output of the device is formed by the junction capacitance of back biased diode D5. Thus, Diode D5 serves the same function as the capacitor C1 of FIG. 4. Diode D5 is made from a base-collector P-N junction and is therefore made with the same characteristics as the base-collector junction Miller capacitance of Q3. The arrangement is particularly suitable for integrated circuit applications, where, during manufacture, variations in the base-collector capacitance $C_{bc}$ of Q3 will be compensated likewise in the formation of D5. While the junction capacitance of D5 is of course smaller than the Miller capacitance of Q3, the feedback capacitive current through D5 is amplified by Q7 to approach the level of the Miller current from the base of Q3 during transition from low to high at the output 24. Because diode D5 is back biased it will not conduct except by capacitive coupling current generation proportional to the rate of change of voltage at the output applied across the junction capacitance.

Whereas the Miller capacitance of Q3 effects a negative feedback of current to the base of Q3 during turn off thereby trying to keep Q3 on, the D5 junction capacitance coupled to the base of Q7 effects a positive feedback during turn off of Q3. The low impedance state of Q7 accelerates the turn off by draining the base of Q3, compensating for the negative feedback effect of the Miller current, diverting Miller current to ground and effecting a positive feedback during transition from low to high at the output of the device. In this respect, Q7 is coupled to constitute a current inversion or polarity reversal using capacitive feedback for an overall positive feedback effect enhancing the transition. Undesirable Miller current at the base of Q3 is reduced and diverted away by positive feedback.

It can be seen that the coupling of D5 and Q7 in FIG. 5 or the coupling of capacitor C1 and Q7 in FIG. 4 permits capacitively coupling and following voltage changes in the output of the device; then generating a positive feedback capacitive current through the coupling and amplifying the positive feedback capacitive current to approach or equal the negative feedback capacitive Miller current at the base of the pulldown element junction transistor means; and finally reducing the negative feedback Miller current with the amplified positive feedback capacitive current.

From another perspective, the foregoing embodiments of the present invention implement the steps of capacitively coupling and following voltage changes at the output of the device, generating capacitive feedback current through the coupling during transition from low to high at the output of the device, and amplifying the capacitive feedback current to approach or equal the Miller feedback current at the base of the pulldown element junction transistor means. Thereafter the coupling arrangement of the invention effects reversing the polarity of the amplified capacitive current and applying it to the base of pulldown transistor means thereby neutralizing Miller feedback current at the base of the pulldown transistor.

Another innovation of the circuit of FIG. 5 is that the junction capacitance D5 is coupled to the base of the second stage transistor Q6 of the Darlington pullup element, rather than directly to the output. At the base of Q6 the coupling capacitance follows voltage changes at the output, but indirectly and isolated from the output by transistor Q6 and resistor R5. By this expedient, a reflection, transient or spike voltage at the output is prevented from turning on Q7 and consequently discharging the base of Q3, turning it off, permitting the output voltage $V_o$ to go even higher.

With respect to other components in the circuit of FIG. 5, Diode D7 performs the same function described with reference to the circuit in FIG. 4.

The diode D6 added in the circuit arrangement of FIG. 5 connects the base of Q3 to the base of Q7. Clamping the base of the active element discharge transistor Q7 to the base of the pulldown element transistor Q3 prevents the voltage at the base of Q7 from following the capacitive coupling D5 to too low a potential during transition from high to low at the output of the device. By keeping the base of Q7 from going too low the discharge transistor Q7 can timely respond to a transition from low to high at the output of the device and timely discharge the capacitive feedback Miller current from the base of the pulldown element. Thus, when Q3 is conducting, the voltage at the base of Q3 is about 0.8 volts. During high to low transition, the base of Q7 will start to follow the voltage at the base of Q6, but below 0.8 volts the base of Q7 is clamped through D6 to the base of Q3 and won't go below 0 to 0.2 volts. Thus, the result is that D6 clamps voltage at the base of Q7 to a level at or above ground and prevents swings to negative voltage that would retard the response of Q7 during a subsequent low to high transition at the output.

Representative values for resistances in the circuits of FIGS. 4 and 5 are presented in Tables 1 and 2 respectively.

TABLE 1

| Resistor | Value (Ohms) |
| --- | --- |
| R1 | 10K |
| R2 | 4K |
| R4 | 45 |
| R5 | 5K |
| R7 | 2K |
| R8 | 3K |

TABLE 2

| Resistor | Value |
| --- | --- |
| R1 | 10K |
| R2 | 10K |
| R3 | 4K |
| R4 | 45 |
| R5 | 5K |
| R6 | 15K |
| R7 | 2K |
| R8 | 3K |

Transistors are of the NPN type either regular or Schottky-clamped as required in TTL logic with diodes of the PN type either regular or Schottky-clamped. All may be fabricated according to the well-known and well-documented procedures of solid state integrated circuit technology. Typical circuit characteristics and design considerations for these components are found, for example, in the *Fairchild Low Power Schottky Data Book* of the Fairchild Camera and Instrument Corporation, 464 Ellis Street, Mountain View, Calif. 94942, Copyright 1977.

The coupling capacitance for following changes in voltage at the output of the device and feedback of capacitive current for reducing the Miller current may take a variety of forms. In addition to the conventional and junction capacitances described above, the feedback capacitive coupling may include MOS, MIS, MOM, and MIM capacitors as is known in the integrated circuit art, for example.

While the invention has been described with reference to two particular transistor logic output gate circuits, it is apparent that it is applicable for modifying transistor logic output devices generally for reducing power consumption and improving speed and transfer characteristics during transition from low to high voltage at the output of the device. The invention also has application generally for eliminating the problems caused by parasitic capacitive Miller current in solid state devices.

I claim:

1. In a transistor logic output device of the type comprising an input and an output for binary data signals of high and low potential, pullup element for sourcing current to the output from high potential, pulldown element for sinking current from the output to low potential, phase splitter element coupled at the input to control the pullup and pulldown elements, said elements comprising junction transistor means, said pulldown element transistor means characterized by relatively large base-collector junction capacitance resulting in undesirable parasitic capacitive feedback Miller current to the base of the pulldown element transistor means during transition from low to high potential at the output of the device, the improvement for diverting and discharging the base-collector capacitive feedback Miller current comprising:

active element transistor means coupled between the base of the pulldown element transistor means and ground or low potential normally defining a high impedance path when the active element transistor means is non-conducting, the base of said active element capacitively coupled to follow the change in potential at the output of the device during transition from low to high potential at the output of the device for capacitive feedback of current to drive the active element to conduction and provide a low impedance path for diverting and discharging capacitive feedback Miller current from the base of the pulldown element thereby enhancing the speed of turnoff of the pulldown element transistor means and reducing power consumption otherwise caused by the undesirable tendency of negative feedback Miller current to maintain the pulldown element in a conducting state, said active element transistor means coupled to the base of the pulldown element transistor means through diode means to prevent the potential level at said base from being pulled too low relative to the level at the device input.

2. An improved transistor logic output device as set forth in claim 1 wherein said active element capacitive coupling comprises a junction capacitor having characteristics similar to the base-collector junction of the pulldown element transistor means.

3. In a transistor logic output device of the type comprising an input and an putput for binary data signals of high and low level potential, pullup element for sourcing current to the output from high potential, pulldown element for sinking current from the output to low potential, phase splitter element coupled at the input to control the pullup and pulldown elements, said elements comprising junction transistor means, the improvement comprising:

active element discharging transistor means coupled between the base of the pulldown element transistor means and ground or low potential for actively controlling a route to ground or low potential for diverting and discharging the so-called capacitive feedback Miller current generated during the low to high potential transition at the output of the device and resulting from base-collector junction capacitance in the pulldown element transistor means;

capacitive coupling means coupled at the base of said active element discharging transistor means to follow changes in voltage at the device output and capacitively feed back current during the transition from low to high potential at the device output for driving the base of the discharge transistor thereby providing a low impedance path to ground or low potential at the base of the pulldown element transistor means for diverting and discharging the capacitive Miller feedback current;

and diode means for clamping the base of the active element discharging transistor means to the base of the pulldown element transistor means thereby to prevent the voltage at the base of the discharging transistor means from following the capacitive coupling means to too low a potential during the transition from high to low level potential at the device output whereby the discharge transistor means can timely respond to a transition from low to high level potential at the device output and timely discharge the capacitive feedback Miller current from the base of the pulldown element transistor means.

4. An improved transistor logic output device as set forth in claim 3 wherein said capacitive coupling means comprises a back biased junction capacitor.

5. An improved transistor logic output device as set forth in claim 3 wherein the collector of the active element discharging transistor means is coupled to the base of the pulldown element transistor means through diode means to prevent the potential level at said base from being pulled too low relative to the level at the device input.

6. An improved transistor logic output device as set forth in claim 3 wherein the device also includes a squaring network means coupled between the base of the pulldown element transistor means and ground or low potential, said active element discharging transistor means coupled in parallel with said squaring network means.

7. An improved transistor logic output device as set forth in claim 3 wherein the pullup element transistor means comprises a Darlington circuit including first and second transistors coupled to afford successively first and second stages of gain for sourcing current from high potential to the output, and wherein the capacitive coupling means is coupled to the base of the Darlington circuit second transistor thereby to follow transitions from low to high potential at the device output indirectly to isolate the capacitive coupling from transient voltage changes at the output.

8. A new and improved transistor logic output device comprising:

an input for receiving binary data signals in the form of high and low potential states;

a pullup element comprising transistor means for sourcing current from high potential to the output when the pullup transistor means is conducting;

a pulldown element comprising transistor means for sinking current from the output to low potential when the pulldown transistor means is conducting;

phase splitter element comprising transistor means coupled between the data signal input on the one hand and the pullup and pulldown elements on the other hand for alternately controlling the conducting state or phase of the pullup and pulldown elements thereby alternately to source or sink current at the output in accordance with binary data signals at the input;

an active element for discharging capacitive feedback Miller current comprising transistor means coupled between the base of the pulldown element transistor means and ground or low potential for providing and actively controlling the impedance of a route to ground or low potential for diverting and discharging the capacitive feedback Miller current resulting from base-collector junction capacitance in the pulldown element transistor means which Miller current occurs during the low to high potential transition at the output of the device;

back biased junction capacitor coupling means coupled at the base of said Miller current discharging transistor means to follow changes in potential at the device output for capacitive feedback of current during the transition from low to high potential at the device output to drive the base of the discharge transistor and thereby provide a low impedance path to ground or low potential for diverting and discharging the capacitive Miller feedback current at the base of the pulldown element transistor means;

first diode means coupled between the active element discharging transistor means and the base of the pulldown element transistor means to prevent the potential level at said base from being pulled too low relative to the potential level at the device input;

and second diode means for clamping the base of the active element discharging transistor means to the base of the pulldown element transistor thereby to prevent the voltage at the base of the discharging transistor means from following the capacitive coupling means to loo low a potential during the transition from high to low potential at the device output whereby the discharge transistor means can timely respond to a transition from low to high potential at the output and timely discharge the capacitive feedback Miller current from the base of the pulldown element transistor means.

9. A new and improved transistor logic output device as set forth in claim 8 wherein the device also includes a squaring network means coupled between the base of the pulldown element transistor means and ground or low potential, said active element discharging transistor means coupled in parallel with said squaring network means.

10. An improved transistor logic device as set forth in claim 8 wherein the pullup element transistor means comprises a Darlington circuit including first and second transistors coupled to afford successively first and second stages of gain for sourcing current from high potential to the output, and wherein the junction capacitor coupling means is coupled to the base of the Darlington circuit second transistor thereby to follow transitions from low to high potential at the device output indirectly to isolate the capacitive coupling from transient voltage changes at the output.

* * * * *